United States Patent
Nishizaka et al.

(10) Patent No.: US 6,927,450 B2
(45) Date of Patent: Aug. 9, 2005

(54) NON-VOLATILE SEMICONDUCTOR STORAGE DEVICE HAVING A SALICIDE STRUCTURE

(75) Inventors: Teiichiro Nishizaka, Kanagawa (JP); Toshikatsu Jinbo, Kanagawa (JP); Takaki Kohno, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/387,369

(22) Filed: Mar. 12, 2003

(65) Prior Publication Data

US 2003/0178675 A1 Sep. 25, 2003

(30) Foreign Application Priority Data

Mar. 22, 2002 (JP) ........................................ 2002-080718

(51) Int. Cl.[7] ........................ H01L 29/792; H01L 29/76; H01L 29/94; H01L 31/062; H01L 31/113
(52) U.S. Cl. ........................ 257/324; 257/326; 257/390
(58) Field of Search ................................ 257/324, 325, 257/326, 390

(56) References Cited

U.S. PATENT DOCUMENTS

| | | | | |
|---|---|---|---|---|
| 5,168,334 A | * | 12/1992 | Mitchell et al. | 257/324 |
| 5,331,181 A | * | 7/1994 | Tanaka et al. | 257/23 |
| 5,436,481 A | * | 7/1995 | Egawa et al. | 257/324 |
| 5,990,514 A | * | 11/1999 | Choi et al. | 257/315 |

FOREIGN PATENT DOCUMENTS

| | | |
|---|---|---|
| JP | 2001-512290 | 8/2001 |
| JP | 2003-258135 | 9/2003 |
| WO | WO 99/07000 | 2/1999 |

OTHER PUBLICATIONS

T.Y. Luo, et al. Effect of $H_2$ Content on Reliability of Ultrathin In–Situ Steam Generated (ISSG) $SiO_2$ IEEE Electron Device Letters, vol. 21 No. 9 Sep. 2000 pp. 430–432.

* cited by examiner

*Primary Examiner*—Ngân V. Ngô
(74) *Attorney, Agent, or Firm*—Katten Muchin Zavis Rosenman

(57) ABSTRACT

A method of manufacturing a semiconductor device include a step of forming an insulating layer, which is obtained by building up a first oxide film, a nitride film and a second oxide film on a substrate in the order mentioned, and a Salicide step of forming a Salicide-structure gate electrode on the insulating film. A silicidation reaction between the substrate surface and an N+ diffusion region is prevented in the Salicide step by causing the insulating layer to remain even in a region on the substrate besides that immediately underlying the gate electrode.

8 Claims, 11 Drawing Sheets

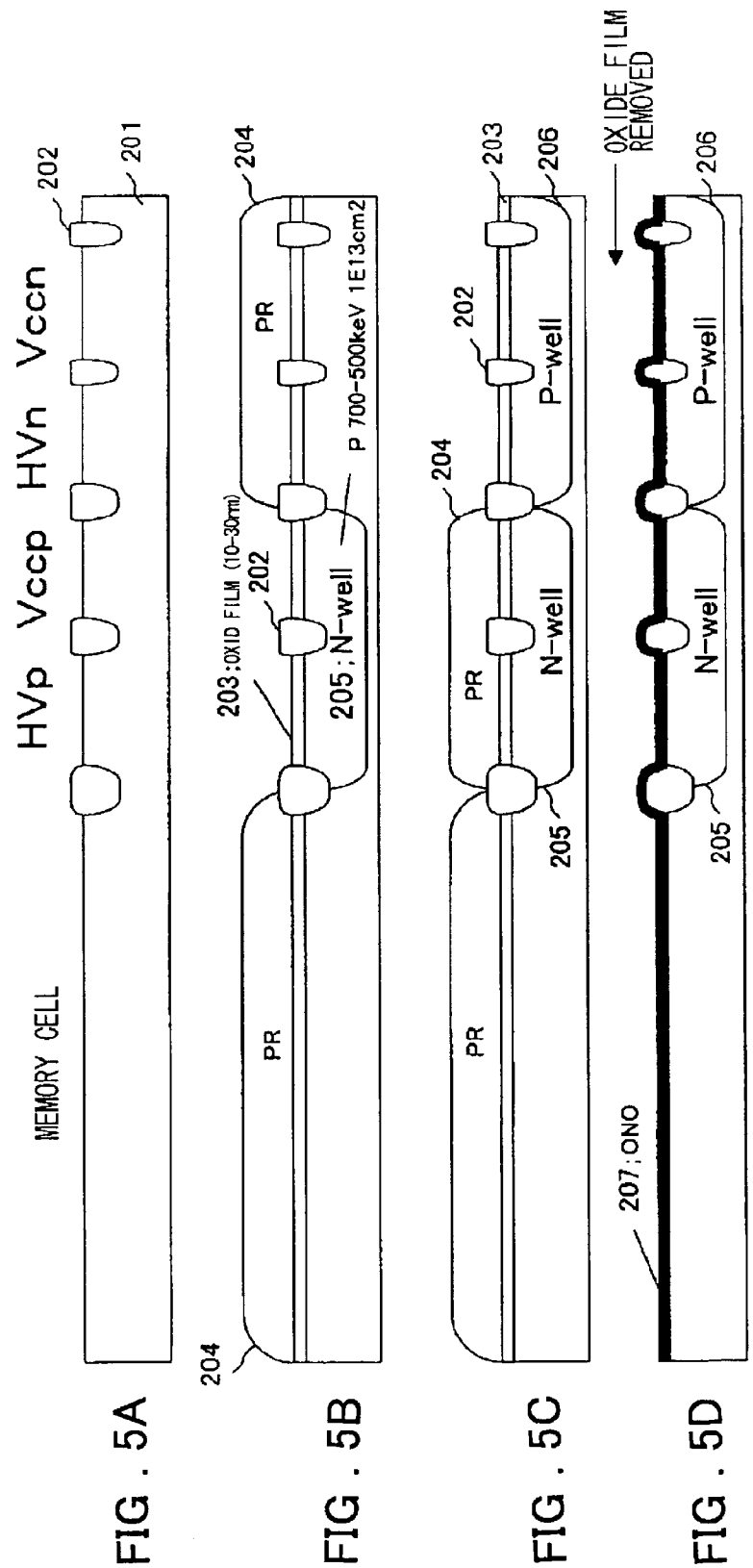

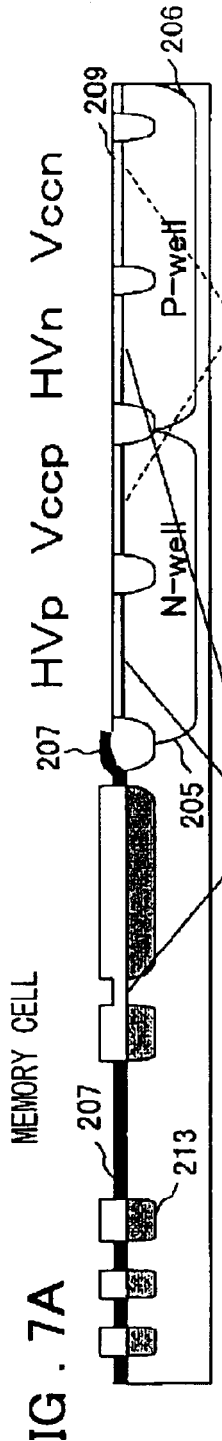
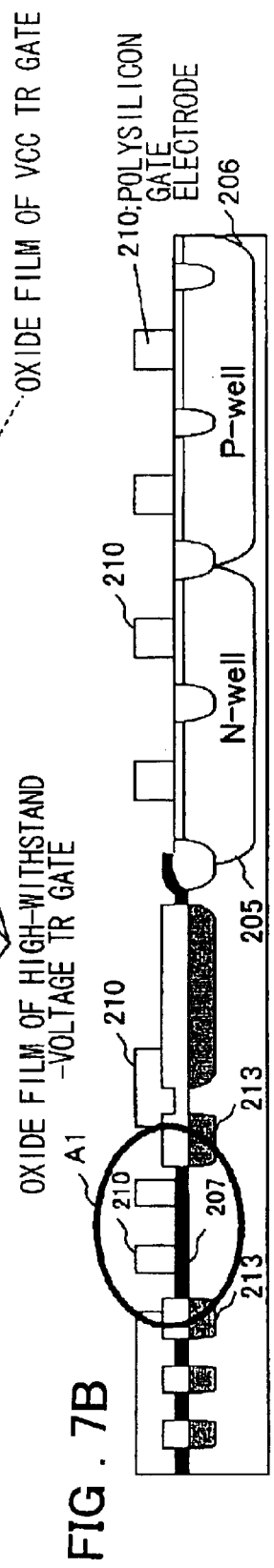
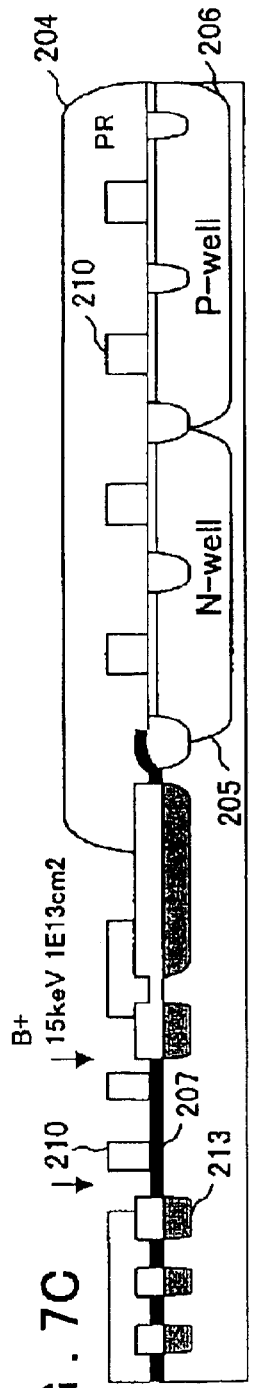
FIG. 7A
FIG. 7B
FIG. 7C

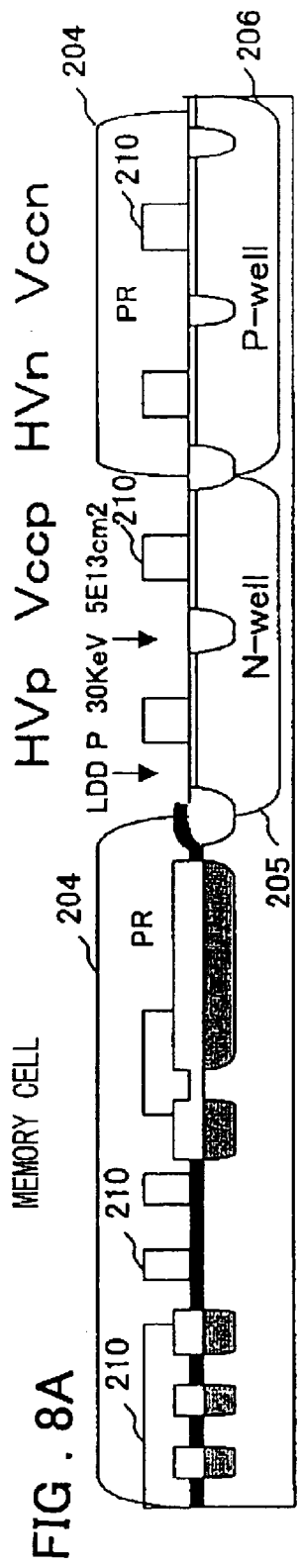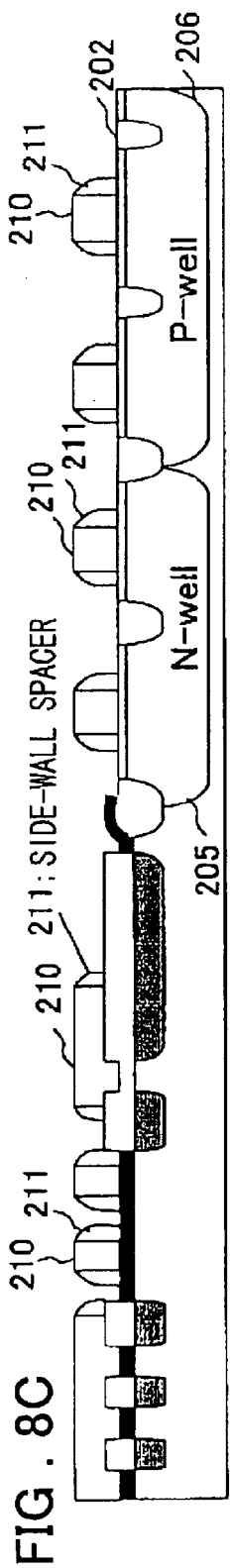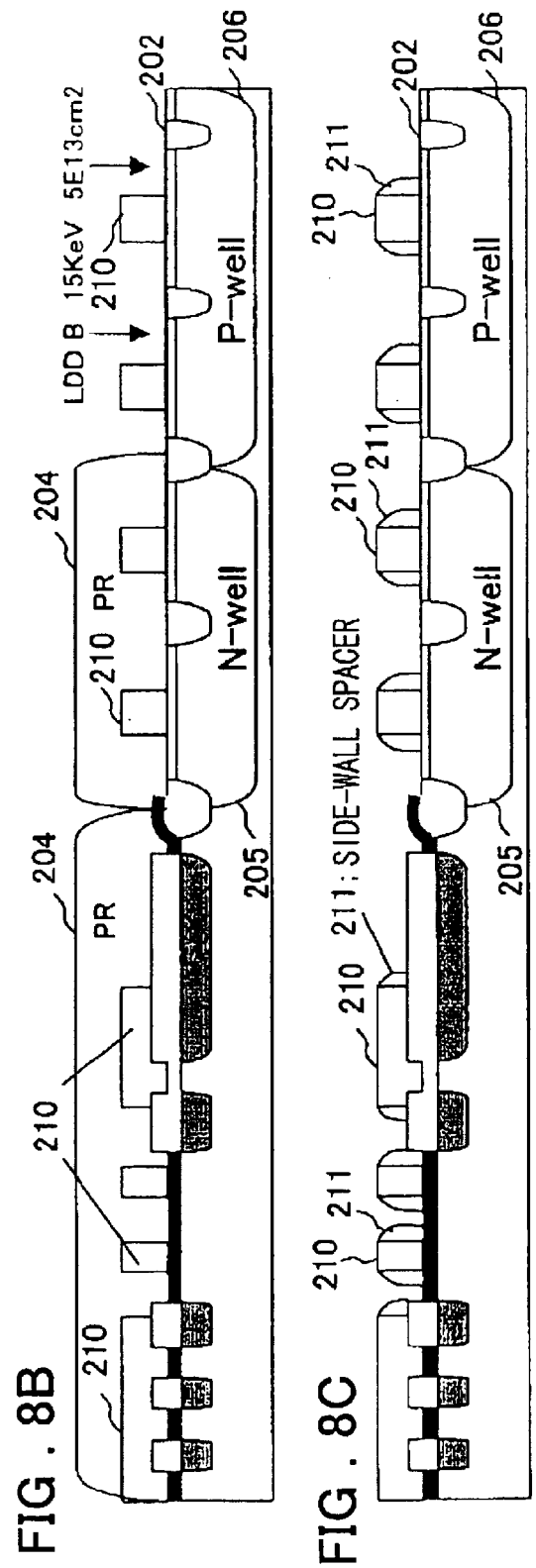
FIG. 8A
FIG. 8B
FIG. 8C

NON-VOLATILE SEMICONDUCTOR STORAGE DEVICE HAVING A SALICIDE STRUCTURE

FIELD OF THE INVENTION

This invention relates to a semiconductor device and to a method of manufacturing the same. More particularly, the invention relates to a non-volatile semiconductor storage device having a Salicide (Self-aligned silicide) structure and to a method of manufacturing the same.

BACKGROUND OF THE INVENTION

In a semiconductor storage device in which bit lines of a memory cell array are constituted by impurity conduction regions provided in the substrate surface, there are no separation areas between the transistors that separates memory cells and therefore the memory cells can be made small in size. This is suitable for increasing storage capacity. However, since the bit lines are composed by the impurity conduction regions provided in the silicon substrate surface, the device cannot be adapted to high-speed operation owing to the resistance and stray capacitance, etc., of the bit lines. As a result of the increase in storage capacity, the bit lines become greater in length and high-speed operation is difficult to achieve. Another problem is that an increase in the length of the bit lines results in reduced write voltage applied to the memory cell, wherein the decline in write voltage is ascribable to the resistance of the bit lines. A semiconductor device for solving these problems has been proposed by the present applicant in the specification of Japanese Patent Application No. 2001-394216.

As one example of background art relating to the present invention, consider a rewritable non-volatile semiconductor device having an ONO(Oxide-Nitride-Oxide) 3-layer stack as a gate dielectric structure. This will be described with reference to FIG. 4.

As shown in FIG. 4, an ONO layer 122 provided on a channel between N+ diffusion regions 124 of a P-type silicon substrate 121 is obtained by forming first a film of silicon oxide, then forming a film of silicon nitride which functions as an electron trapping layer, on the silicon oxide film, and then forming a film of silicon oxide on the silicon nitride film. An electrically conductive gate electrode 125 is formed on the ONO layer 122. FIG. 4 schematically illustrates an arrangement in which two bits are stored in one memory cell.

Polysilicon used as the gate electrode has a comparatively high specific resistance. Accordingly, it has been contemplated to lower the gate film resistance by building up a silicide of a high-melting-point metal or semiprecious metal such as $MoSi_2$, $WSi_2$, $TiSi_2$, $CoSi_2$ or the like, on the gate polysilicon.

Furthermore, in order to suppress gate resistance and source-drain resistance ascribable to finer patterns, a Salicide(Self-aligned silicide) structure in which source and drain are silicidated together with a gate electrode by a single process has become important as a technique for reducing the resistance of the gate electrode as well as the source-drain resistance.

In a case where this Salicide technique is applied to a non-volatile semiconductor storage device in which bit lines are constructed by impurity conduction regions (N+ diffusion regions) provided in a silicon substrate and which has an ONO layer as the gate dielectric layer, on the surface of the silicon substrate between the impurity conduction regions besides the regions where the gate electrodes are formed reacts with a high-melting-point metal together with the gate polysilicon. As a result, silicidation takes place, element isolation afforded by the PN junction ceases to function and the N+ diffusion regions are short-circuited. This problem will be described later in greater detail.

SUMMARY OF THE DISCLOSURE

Accordingly, it is an object of the present invention to provide a semiconductor device that uses an impurity conduction layer, as well as a method of manufacturing the device, wherein the short-circuiting of conduction layers owing to silicidation of a substrate surface is prevented when a gate electrode having a Salicide structure is formed, thereby improving yield and reliability.

According to one aspect of the present invention, the foregoing object is attained by providing a method of manufacturing a semiconductor device comprising a step of laminating on a substrate, first a first oxide film, then a nitride film, and then a second oxide film to form an insulating film; and a Salicide step of forming a Salicide-structure gate electrode on the insulating film; wherein a silicidation reaction on a surface of the substrate in a region that is not to undergo silicidation is prevented in said Salicide step by causing the insulating film to remain even in a region on the substrate besides that immediately underlying the gate electrode.

According to another aspect of the present invention, there is provided a method of manufacturing a semiconductor device comprising a first step of forming an insulating film on a substrate by laminating on the substrate, first a first oxide film, then a nitride film and then a second oxide film on the substrate; a second step of selectively removing the insulating film formed on a surface of the substrate that constitutes a memory cell area, and forming a plurality of parallel extending conductive regions, which consist of an impurity, in a region from which the insulating film has been removed; and a third step of forming a Salicide-structure gate electrode on the insulating film as a gate electrode of a memory-cell transistor in which two of the parallel conductive regions that are mutually adjacent serve as a source and drain; wherein a silicidation reaction of the substrate surface in a region that is not to undergo silicidation is prevented in the third step by causing the insulating film to remain even in a region besides a channel region immediately underlying the gate electrode of the memory-cell transistor.

In the present invention, the first oxide film is preferably formed by performing oxidation according to the ISSG (In-Situ Steam Generation) method. The second oxide film is preferably formed by oxidizing the nitride film or by the ISSG method.

A semiconductor device, according to another aspect of the present invention, comprises: a substrate; an insulating film provided on the substrate, said insulating film comprising first and second oxide films, and a nitride film sandwiched by said first and second oxide films; and a Salicide-structure gate electrode disposed on said insulating film; said insulating film being provided even in a region on said substrate besides that immediately underlying said gate electrode.

According to another aspect of the present invention, there is provided a semiconductor device comprising: a plurality of parallel extending conductive regions, which consist of an impurity, on a substrate surface constituting a region of a memory cell array; an insulating film comprised of first and second oxide film, and a nitride films sandwiched between said first and second oxide films, as a dielectric film immediately underlying a gate electrode of a memory-cell transistor in which two of the parallel conductive regions that are mutually adjacent serve as a source and drain; and a Salicide-structure gate electrode on the insulating film; wherein the insulating film is provided even in a region besides a channel region immediately underlying the gate electrode of the memory-cell transistor.

In the present invention, the insulating film is left remaining in the channel region and at locations other than areas where the conductive regions of the memory cell array are formed. In the present invention, it is preferred that the insulating film be left remaining at least in areas between the conductive regions of the substrate surface of the memory cell array.

In the present invention, the insulating film that is left remaining includes at least the first oxide film and the nitride film from among the three films built up on the substrate.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 2A and 2B schematically illustrate a cross section of an area A in FIG. 1, in which FIG. 2A is a diagram useful in describing an embodiment of the present invention and FIG. 2B shows an example for purposes of comparison;

FIGS. 5A~5D to FIGS. 10A~10C are sectional views (parts 1 to 6, respectively) schematically illustrating the principal portion of a manufacturing process, in the order of the process steps thereof, according to an embodiment of the present invention.

PREFERRED EMBODIMENTS OF THE INVENTION

Figure 1:
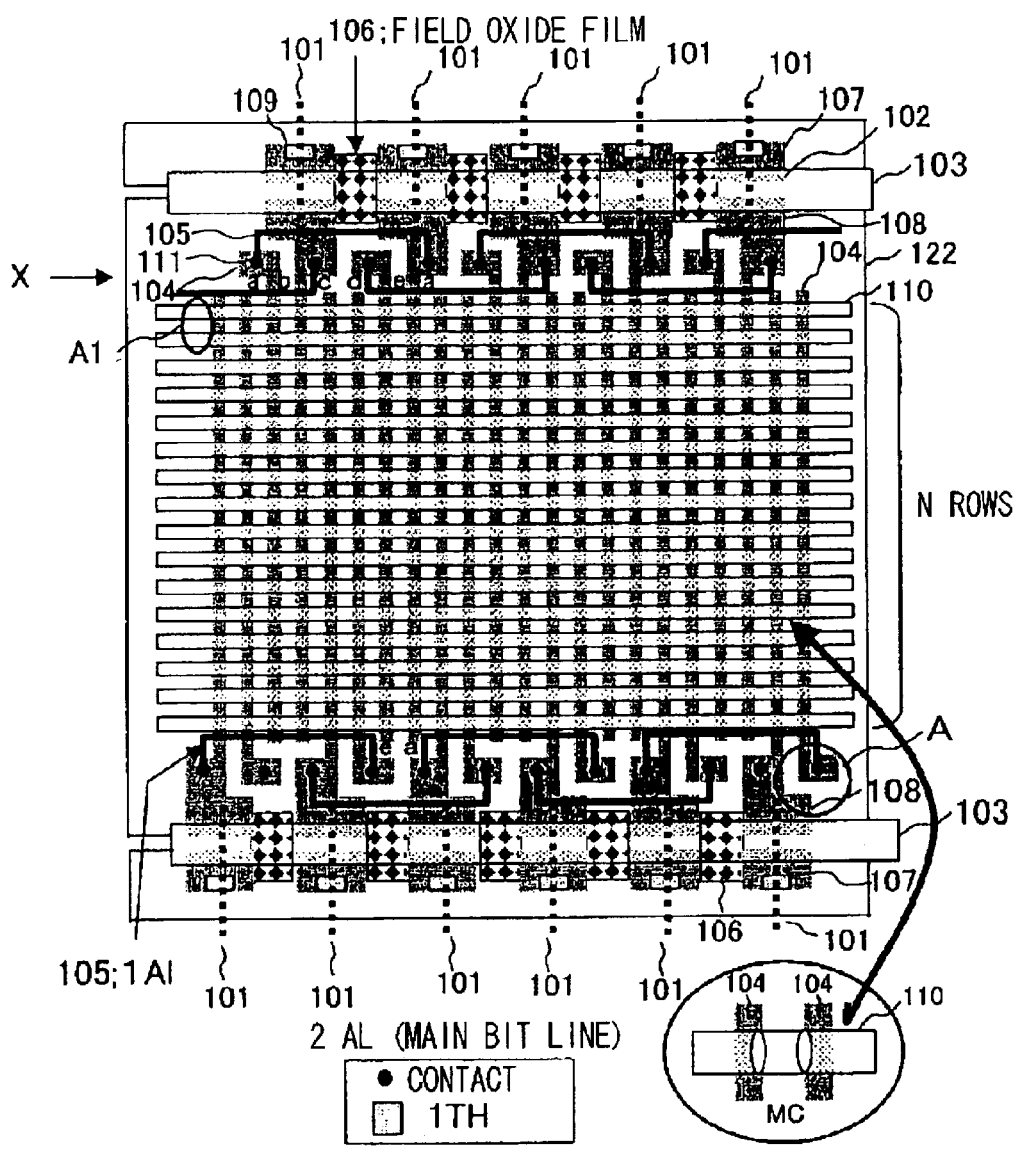
FIG. 1 is a diagram illustrating the layout of an embodiment according to the present invention.

A preferred embodiment of the present invention will now be described.

A semiconductor device, in accordance with a preferred embodiment of the present invention, has an ONO(Oxide-Nitride-Oxide) layer obtained by laminating on a semiconductor substrate, first a first oxide film, then a nitride film and then a second oxide film, and has a gate electrode having a Salicide-structure, formed on the ONO layer. The ONO layer (122 in FIG. 1) is provided even in a region on the substrate besides that immediately underlying the gate electrode (110 in FIG. 1).

According to the present invention, there is provided a method of manufacturing a semiconductor device having a plurality of conductive regions (104 in FIG. 1) composed by a plurality of parallel extending impurity-diffusion regions formed in a substrate surface of an area of a memory cell array; an insulating film (122) obtained by laminating on the substrate surface, first a first oxide film, then a nitride film and then a second oxide film, as a dielectric film immediately underlying a gate electrode of a memory-cell transistor in which two of the parallel conductive regions that are mutually adjacent serve as a source and drain; and a Salicide-structure gate electrode formed on the insulating film; wherein the insulating film (122) is caused to remain even in a region besides a channel region immediately underlying the gate electrode of the memory-cell transistor. In the Salicide step, therefore, the silicidation reaction on the substrate surface in a region that is not to undergo silicidation is prevented. This makes it possible to avoid short-circuiting of the conductive regions (104).

More specifically, a plurality of parallel extending conductive regions (104) consisting of an impurity are provided in a substrate surface that constitutes the region of a memory cell array. Two of the conductive regions are treated as a pair and are interconnected by a wiring (105) constituting an upper layer of the substrate or by a conductive region (104A in FIG. 11) formed in the substrate surface, whereby a set of sub-bit lines are composed. Further, a plurality of gate electrodes (110) are formed in a direction that perpendicularly intersects the longitudinal direction of the sub-bit lines, whereby word lines are composed. One set of sub-bit lines are connected to a main bit line (101) via a corresponding selection transistor (102). A plurality of the selection transistors (102) are disposed in opposition on both sides of the memory cell array.

Plural of sets of the sub-bit lines connected to associated ones of a plurality of selection transistors on one side of the memory cell array and plural sets of the sub-bit lines connected to associated ones of a plurality of selection transistors on the other side of the memory cell array are arranged alternately or in interdigital fashion.

An insulating layer (ONO layer: 122), which is obtained by building up on a substrate surface, first a first oxide film, then a nitride film and then a second oxide film, is formed on the substrate surface as the gate dielectric film of the memory-cell transistors. A Salicide-structure gate electrode is formed on the insulating film. In a programmable non-volatile semiconductor memory device having such a structure, the insulating film (122) is left remaining even in a region besides that immediately underlying the gate electrode of the memory cell array, thereby preventing silicidation of the substrate surface between the conductive regions (104) in the Salicide step and avoiding the occurrence of short circuits.

In this embodiment of the present invention, the insulating film (122) is left remaining in the channel region and at locations other than the areas where the conductive regions (104) of the memory cell array are formed. In the present invention, the insulating film may preferably be left remaining at least in areas between the conductive regions (104) of the substrate surface of the memory cell array.

A method of manufacture according to the present invention comprises a step of forming an insulating film (207 in FIG. 5D) on a substrate by building up on the substrate, first a first oxide film, then a nitride film and then a second oxide film on a substrate; a second step of selectively removing the insulating film formed on the surface of the substrate that constitutes a memory cell area, and forming a plurality of parallel extending conductive regions (213 in FIG. 6A), which consist of an impurity, in regions from which the insulating film has been removed; and a Salicide step of forming a Salicide-structure (212 in FIG. 10A) gate electrode on the insulating film as a gate electrode of a memory-cell transistor in which two of the parallel conductive regions that are mutually adjacent serve as a source and drain; wherein a silicidation reaction between a metal constituting the gate electrode and the substrate surface in a region that is not to undergo silicidation is prevented in the Salicide step by causing the insulating film to remain even in a region besides a channel region immediately underlying the gate electrode of the memory-cell transistor.

In this embodiment of the present invention, the second and first oxide films constituting the ONO layer are manufactured by oxide formation using the ISSG (In-Situ Steam Generation) method. Using the ISSG oxidation method makes it possible to greatly improve upon the write/erase repetition lifetime specific to a semiconductor memory device having a MONOS structure.

In the present invention, the insulating film that is left remaining includes at least the silicon-oxide film that is the lowermost layer and the silicon-nitride film on this layer from among the three layers build up on the substrate.

A preferred embodiment of then present invention will now be described in detail with reference to the drawings.

FIG. 1 is a diagram illustrating an example of a layout configuration of a semiconductor memory device according to a preferred embodiment of the present invention. FIG. 1 shows one portion (block) of a memory cell array in a case where the present invention is applied to a rewritable non-volatile semiconductor memory device. A characterizing structural feature of this embodiment of the present invention is that an ONO film 122 is left remaining even in a region besides a channel region immediately underlying a gate electrode 110 of a memory cell MC. This structural feature of this embodiment will be described below with reference to FIG. 1.

As shown in FIG. 1, a memory cell array in which a plurality of the memory cells MC are disposed in the form of an array has a hierarchical bit-line architecture comprising main bit lines and sub-bit lines. The sub-bit lines are obtained by forming a plurality of parallel extending conductive regions (referred to as buried N+ lines) 104 consisting of N+ diffusion regions formed in a P-type silicon semiconductor surface, by way of example. The main bit lines 101 are obtained by forming patterns on a second interconnect layer (2 Al). The main bit line 101 is connected to the associated set of sub-bit lines by selection transistors (referred to as "block selection transistors") 102 each of which is turned on and off by a selection control line 103 connected to the gate thereof.

More specifically, the region of the memory cell array on the substrate surface has a first group of a plurality of conductive regions 104 (e.g., a, b, e, . . . ) extending in parallel from one side of the memory cell array to the opposing other side and a second group of a plurality of conductive regions 104 (e.g., c, d, . . . ) extending in parallel from the other side of the memory cell array to the one side.

A plurality (N-number) of the gate electrodes 110 extending in parallel with one another are formed on the ONO layer 122 in a direction perpendicularly intersecting the direction along which the conductive regions 104 extend.

A pair of conductive regions 104 belonging to the same group, form a set of sub-bit lines and one of the paired conductive regions constituting one of sub-bit lines is connected to a diffusion region 108 of a selection transistor 102 which has its gate connected to the selection line 103. The main bit line 101 provided on the second interconnect layer is connected to another diffusion region 107 of the selection transistor 102 by a through-hole 109 and a contact, which is not shown.

Each of a pair of mutually spaced-apart conductive regions 104 constituting one set of sub-bit lines has its end that is situated on the side of the associated selection transistor 102 connected to one wiring 105 formed on a first interconnect layer (1 Al) by a contact 111.

Disposed between two conductive regions a and a belonging to the first group and constituting one set of sub-bit lines, are b and e, each being one of two pairs of conductive regions constituting two sets of sub-bit lines which are connected via associated selection transistors to respective ones of two main bit lines situated on both sides of a main bit line to which the one set of sub-bit lines are connected via an associated selection transistor, and two conductive regions c and d, each being one of two pairs of conductive regions constituting two sets of sub-bit lines connected to two neighboring main bit lines via associated selection transistors on the side opposite the selection transistors to which the one set of sub-bit lines are connected, for a total of four conductive regions.

A plurality (N-number) of the Salicide-structure gate electrodes 110, which have been obtained by forming a metal silicide in self-aligning on a polysilicon gate (not shown) and on both diffusion regions that will serve as a source/drain, are arrayed in parallel on the substrate via the ONO layer 122 so as to intersect the conductive regions 104. These gate electrodes 110 serve as word lines, in which a prescribed voltage is applied selectively to a row designated by a row decoder (not shown).

Gate electrodes (referred to as "selection gate electrodes") 103 are arrayed so as to lie astride the diffusion regions 107 and 108 on both sides of the N-number of gate electrodes 110 (the upper and lower sides of the memory cell array in FIG. 1). Thus are formed the selection transistors 102, in which the selection gate electrode 103 serves as the gate and the diffusion regions 107/108 serve as the drain/source. The selection gate electrode 103 has a Salicide structure, in which the metal silicide has been formed on the polysilicon gate (not shown).

In one embodiment of the present invention, isolation between selection transistors 102 is achieved by a field oxide film 106. In comparison with isolation by an impurity doped region formed by ion implantation and the like, this structure makes it possible to raise the withstand voltage of the selection transistors 102 and to suppress a voltage drop supplied to the conductive region of a memory cell to which data is written at writing time.

In transistors that construct the memory cells MC, gate electrodes 110 arranged in common for each row construct a word line, and word lines are activated selectively by a row decoder (not shown). The selection transistors 102 are such that selection gate electrodes 103 are common on both sides of the memory cell array, and the selection gate electrodes 103 form selection control lines.

The main bit lines 101 are formed on the second aluminum interconnect layer (2 Al) and are activated selectively upon receiving a column-select signal from a column decoder (not shown). That is, two main bit lines, for example, are designated in accordance with address data, power-supply voltage and ground potential are applied to respective ones of these main bit lines, the selection transistors 102 respectively connected to the designated main bit lines 101 are turned on, the conductive region 104 constituting the sub-bit lines are connected to the main bit lines 101, and two mutually adjacent conductive regions 104 are activated selectively.

The main bit lines 101 formed on the second aluminum interconnect layer (2 Al) which is situated as an upper layer of the substrate are connected to the first aluminum interconnect layer (1 Al) via the through-holes (TH) 109 and are connected to the diffusion region 107 of the selection transistor 102 via a contact, not shown. The diffusion region 108 of the selection transistor 102 extends into the surface of the substrate as is and composes one of the paired conductive regions 104 constituting a set of sub-bit lines. The conductive region 104 is formed in the substrate surface at the same time as the diffusion regions 107 and 108.

The memory cell MC has the ONO layer 122, which is formed by stacking a first silicon oxide film, a silicon-nitride film and a second silicon oxide film, in a channel region located at a gap between mutually adjacent conductive regions 104. The ONO layer 122 immediately underlying a gate electrode of the memory cell MC acts as an electron trapping layer and forms a storage node. The gate electrodes 110 perpendicularly intersecting the longitudinal direction of the conductive regions 104 are formed in common with one row of a plurality of memory cells on the second silicon-oxide film of the ONO layer 122 and construct a word line.

As mentioned above, when a gate electrode having a Co Salicide structure is formed in a MONOS-type memory cell, the substrate surface between the source/drain diffusion regions reacts with the Co, silicidation takes place and the PN junction is short-circuited.

In order to solve this problem, this embodiment leaves the ONO layer even in a region besides that immediately underlying the gate electrode, thereby preventing silicidation of the substrate surface. According to this embodiment, the ONO layer 122 is left remaining in regions other than the conductive region 104 composed by N+ diffusion region on the substrate surface.

Figure 3:
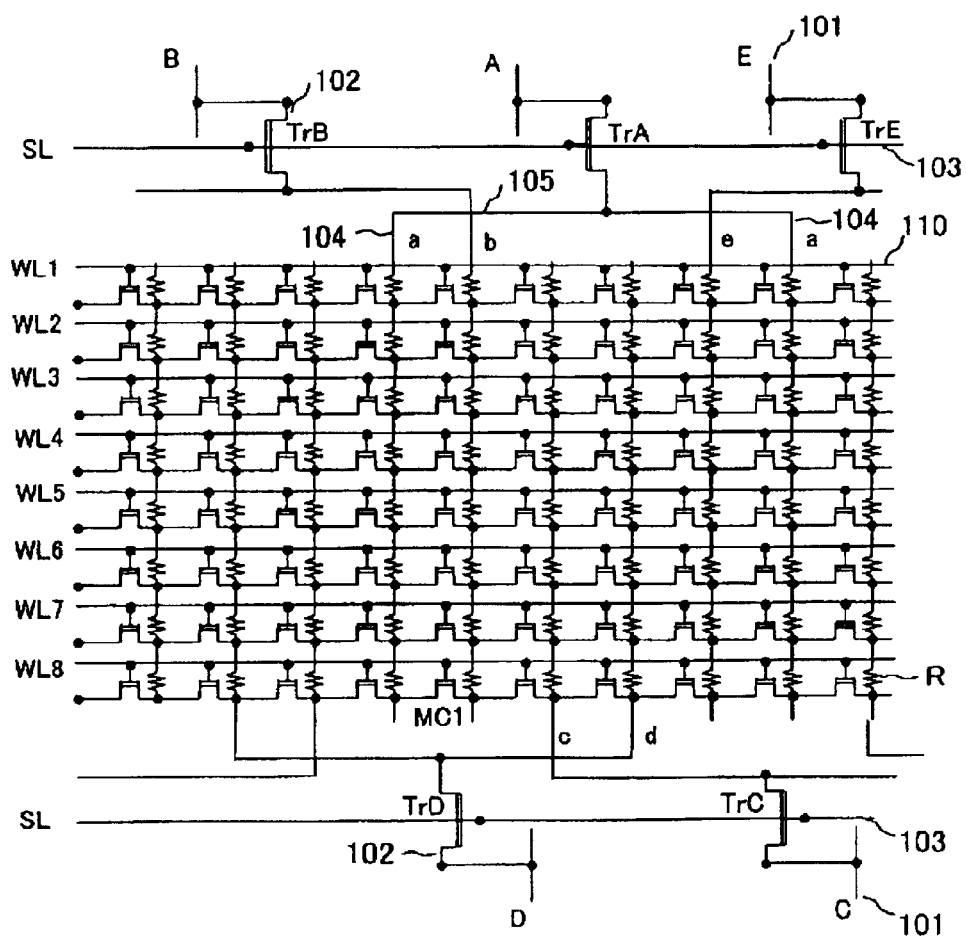
FIG. 3 is a diagram illustrating an equivalent circuit of FIG. 1.

FIG. 3 is a diagram illustrating the circuit structure of a memory cell array according to the embodiment of the invention an example of the layout of which is shown in FIG. 1.

Shown in FIG. 3 are the main bit lines 101, the selection transistors 102, the selection control lines (SL) 103, the sub-bit lines (conductive regions) 104, the wiring 105 connecting the conductive regions constituting a set of the sub-bit lines, and the word lines (WL) 110. The N+ diffusion region constituting a sub-bit line is such that there is a unit resistance value R between memory cells. When a selection control line SL is at the high level, the selection transistor 102 is made conductive and the main bit line is connected to an associated set of sub-bit lines. Disposed in the region between the pair of conductive regions a and a constituting one set of sub-bit lines connected to a main bit line A via a selection transistor TrA that constitutes one selection transistor of a first group of selection transistors on one side of the memory cell array in which a plurality of memory cells MC are arranged in the form of an array, are one right conductive region b and one left conductive region e, each being one of two pairs of conductive regions constituting two set of sub-bit lines connected respectively to two main bit lines B and E connected respectively to selection transistors TrB and TrE adjacent to the selection transistor TrA on both sides thereof, the conductive regions b and e being provided inwardly of the pair of conductive regions a and a; and one left conductive region c and one right conductive region d, each being one of two pairs of conductive regions constituting two set of sub-bit lines connected respectively to two main bit lines C and D via selection transistors TrC and TrD constituting a second group of selection transistors situated on the other side of the memory cell array, the conductive regions c and d being provided inwardly of the pair of conductive regions b and e.

With regard also to the pair of conductive regions b and e connected to the other selection transistors TrB and TrE disposed on one side of the memory cell array, the structure is such that between these conductive regions there are disposed four conductive regions connected to the other selection transistors (a pair of conductive regions connected to the selection transistor on one side and a pair of conductive regions connected to the selection transistor on the other side). A layout configuration in which four sets of sub-bit lines are disposed alternately is repeated along the direction of the word lines. For example, in a case where a word line WL8 and a memory cell MC1 that is composed by conductive regions a and b are selected, the selection gate electrode SL is raised to the high level, the applicable block is selected, the word line WL8 is placed at a prescribed positive voltage Vg and a prescribed positive voltage H or ground potential L is supplied to the main bit lines A and B.

Thus, in accordance with this embodiment, one set of sub-bit lines are constructed by two of the conductive regions 104 interconnected by wiring 105, and plural sets of the sub-bit lines are arranged in alternate or interdigital fashion. As a result, an increase in chip area that accompanies an increase in storage capacity can be suppressed while reducing the resistance value of conductive regions from the selection transistors 102 to the far end. Furthermore, according to the present invention, isolation of the selection transistors is achieved by a field oxide film, whereby an increase in the withstand voltage of the selection transistors is realized and it becomes possible to suppress a decline in the write current (write voltage) to memory cells when data is written.

Figure 4:
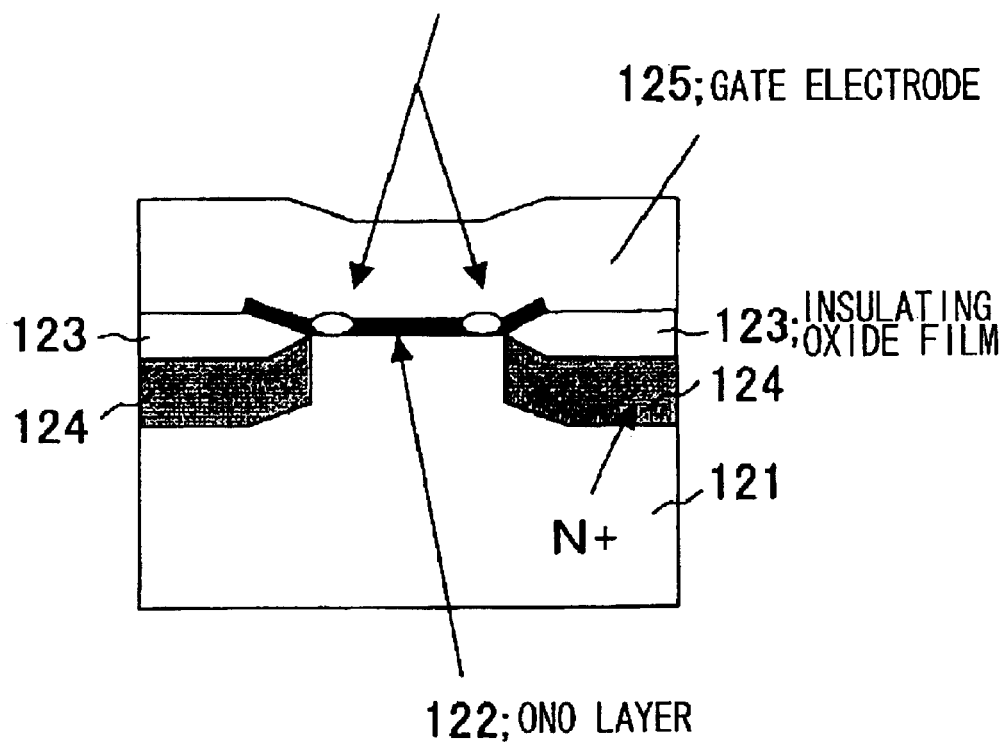
FIG. 4 is a diagram schematically illustrating the structure of a memory cell equipped with an ONO layer and having a 2-bit storage node.

FIG. 4 is a diagram schematically illustrating the structure of the MONOS-type memory cell MC. The P-type silicon substrate 121 is provided with the N+ diffusion regions 124 serving as a source or drain, an insulating oxide film 123 is formed on the N+ diffusion regions 124, and the ONO layer 122 is formed lying astride the exposed surface of the substrate 121 and the edges of the insulating oxide film 123. The Salicide-structure gate electrode 125, which extends along the direction that perpendicularly intersects the longitudinal direction of the N+ diffusion regions 124 is disposed on the ONO layer 122. The edges of the ONO layer 122 at each of the N+ diffusion regions 124 serve as storage nodes 126 for trapping electrons. Two bits of information are stored in one cell. The ONO layer 122 comprises an oxide film (e.g., a film of silicon dioxide) of a first layer, a nitride film (e.g., a film of silicon nitride) of a second layer, and an oxide film (e.g., a film of silicon dioxide) of a third layer. For the details of writing and reading a memory cell equipped with an ONO layer, see the specification of Japanese Patent Kohyo Publication No. P2001-512290A or the specification of Japanese Patent Application No. 2001-394216.

Figure 2A:
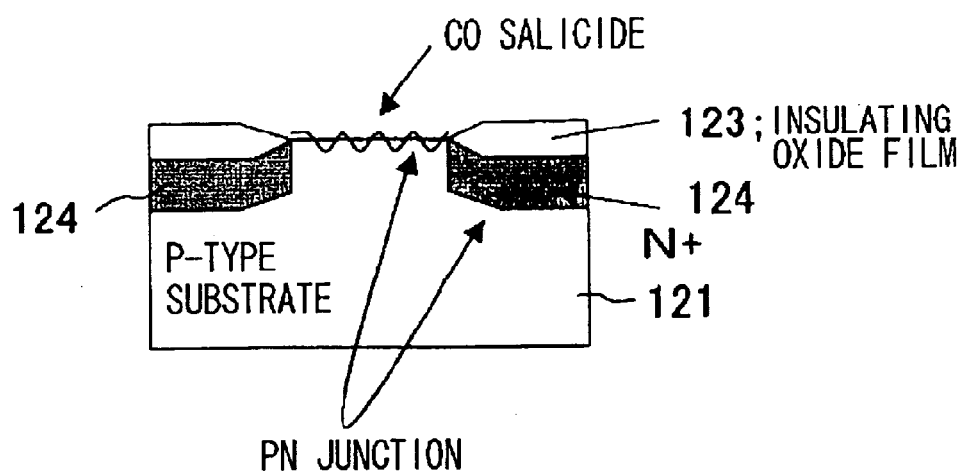
Figure 2B:
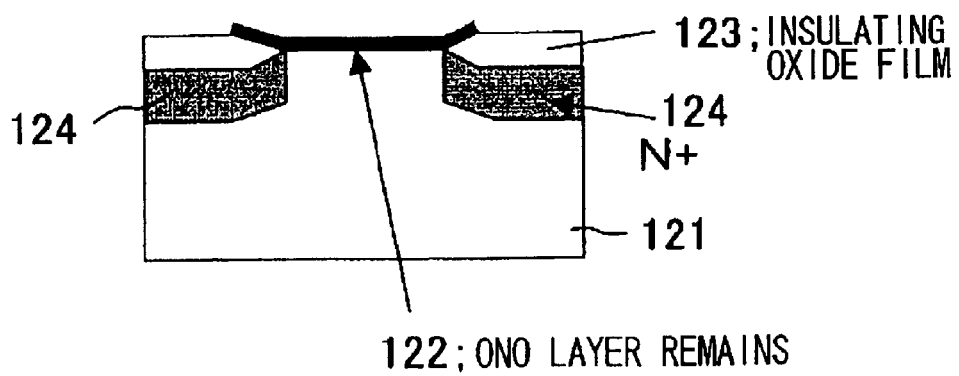

FIG. 2B is a diagram schematically illustrating a cross section, which is taken along the direction perpendicular to the longitudinal direction of the conductive regions 104, of the substrate between conductive regions 104 of the area indicated at A in FIG. 1 (an area besides a memory cell area).

In FIG. 2B, numerals 124 correspond to the conductive regions 104 in FIG. 1. In this embodiment, the ONO layer 122 is provided even in regions beside the channel region immediately underlying the gate electrode 110 (see FIG. 1) between the two conductive regions 124.

By comparison, if the ONO layer is not provided even in regions beside the channel region between the two conductive regions 124 immediately underlying the gate electrode 110, as shown in FIG. 2A, then, when the gate electrode having the Co Salicide structure is formed, the substrate surface between the two conductive regions 124 undergoes Co silicide (Salicide) formation, P-N isolation is not achieved and a short-circuit malfunction occurs.

Thus, in this embodiment, the ONO layer 122 formed in the channel-formation region immediately underlying the gate electrode between the N+ diffusion regions 124 remains between the N+ diffusion regions 124 that undergo isolation. In addition, however, the ONO layer 122 may be left on any region of the substrate except the region where the N+ diffusion region is formed.

An example of a method of manufacturing a semiconductor memory device according to this embodiment of the present invention will now be described with reference to FIGS. 5A–5C to FIGS. 10A–10C. FIGS. 5A to 10C are sectional views illustrating the principal portion of a manufacturing process, in the order of the process steps thereof, according to this embodiment of the present invention. It should be noted that FIGS. 5A–5C to FIGS. 10A–10C are shown on separate pages to facilitate preparation of the drawings. Further, in FIGS. 5A to 10C, the memory cell represents the element region (memory cell array) of the memory cell, HV denotes the portion of high withstand voltage(referred to as "HV" or "Vpp") of the peripheral circuitry of the memory, Vcc represents the usual power-supply portion (referred to as "Vcc"), and p and n of HVp HVn, Vccp, and Vccn represent the transistor element regions of the p and n channels, respectively. Further, the selection transistor is placed at the edge of the memory cell area.

As shown in FIG. 5A, a field oxide film 202 is formed selectively by, e.g., the LOCOS (Local Oxidation of Silicon) method on a P-type silicon semiconductor substrate 201 in order to form an inactive region. The film thickness of the field oxide film 202 is made, e.g., 200 to 400 nm (nanometers). An element region separated by the field oxide films 202 is divided into, e.g., a memory cell, a high-withstand-voltage transistor (HV portion) of the peripheral circuitry and a transistor (Vcc portion) of the usual power-supply portion.

Next, wells are formed in the P-type silicon semiconductor substrate 201 by ion implantation and annealing. In this embodiment, twin wells, namely an N-well and a P-well, are formed.

First, a sacrificial oxide film 203 is formed to a thickness of, e.g., 10 to 30 nm, on the region where the P-type silicon semiconductor substrate 201 is exposed, as shown in FIG. 5B. The sacrificial oxide film 203 is formed by the usual dry oxidation or steam oxidation. Thereafter, a region other than the region where the p-channel transistor will be formed is covered selectively by photoresist 204, and P (phosphorous) ions are implanted at an implantation energy of 700 to 500 Kev and a dose of 1E13 cm$^{-2}$ (where EX represents an exponent of 10 and 1E represents $1 \times 10^X$) in a region where a photomask is not formed, thereby forming an N-well 205. At this time the energy of ion implantation is set in such a manner that the field oxide film 202 will be penetrated but not the photoresist 204.

Thereafter, in order to regulate the threshold value of the p-channel transistor to a desired value, P (phosphorous) or B (boron) ions are implanted into the surface of the region of the N-well 205. The reason for this is that the threshold value of the MOS transistor in the well depends upon the profile of the impurity concentration in the well. The implantation controls the surface concentration.

Next, as shown in FIG. 5C, a region other than the region where the n-channel transistor will be formed is covered selectively by the photoresist 204, and B ions are implanted at an implantation energy of, e.g., 300 to 200 Kev and a dose of 1E13 cm$^{-2}$, thereby forming a P-well 206. At this time the energy of ion implantation is set in such a manner that the field oxide film 202 will be penetrated but not the photoresist 204.

Thereafter, in order to regulate the threshold value of the p-channel transistor to a desired value, B or P ions are implanted into the surface of the region of the P-well 206. The N-well and P-well may be heat-treated at one time.

Next, the photoresist 204 is removed as by ashing in a plasma or the like, and the sacrificial film 203 on the P-type silicon semiconductor substrate 201 is removed using, e.g., buffered hydrofluoric acid. In the description that follows, the removal of the photoresist will be by ashing in plasma or the like.

Next, as shown in FIG. 5D, an ONO layer 207 (a film of silicon oxide, a film of silicon nitride and a film of silicon oxide) is formed on the silicon semiconductor substrate 201. The ONO layer 207 has a three-layer stack structure in which the film of silicon oxide is the lower layer, the film of silicon nitride in the intermediate layer and the film of silicon oxide is the upper layer.

The silicon-oxide film that is the lower layer is formed to a film thickness of, e.g., 6 to 10 nm in an oxidation environment of 750 to 850° C. Alternatively, the silicon-oxide film that is the lower layer may be formed by the ISSG (In-Situ Steam Generation) oxidation method. For a discussion of the ISSG oxidation method, refer to, e.g., IEEE Electron Device Lett. Vol. 21, No. 9 p430–432, 2000. Using the ISSG oxidation method makes it possible to greatly improve upon the write/erase repetition lifetime specific to a semiconductor memory device having a MONOS structure. The reason for this is that since electron trapping is reduced by ISSG oxidation, the amount of electrons trapped in the storage node of the ONO layer is reduced at the time of repetitive operation, as a result of which variation of characteristics is diminished.

In the ONO layer 207, the silicon-nitride film on the silicon oxide film that is the lower layer is formed by the CVD (Chemical Vapor Deposition) method. The final film thickness of the silicon-nitride film is adjusted to, e.g., 2 to 10 nm taking into consideration the amount oxidized when the silicon oxide film is formed on the underlying silicon-nitride film.

The silicon-oxide film that is the upper layer of the ONO layer 207 is formed by oxidizing the silicon-nitride film. Here the silicon-oxide film is formed upon oxidizing the silicon-nitride film in an oxidation environment of, e.g., 1000 to 1150° C. Another method of forming the silicon-oxide film constituting the upper layer of the ONO layer 207 naturally is by oxidation using the ISSG oxidation method. Preferably, the film thickness of the silicon-oxide film that is the upper layer is 3 to 10 nm.

Figure 6A:
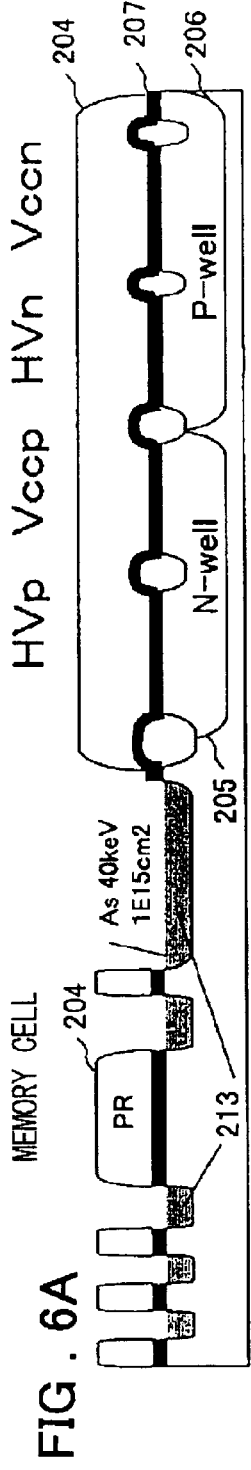

Next, as shown in FIG. 6A, the ONO layer 207 of the region that will be the N+ diffusion region is removed in the region of the memory cell. In the region of the memory cell, the ONO layer 207 in regions other than the region that will be the N+ diffusion region is covered with the photoresist 204. As a result, this ONO layer 207 is left remaining. Further, the regions of the transistors of the high-withstand-voltage portion on the side of the peripheral circuitry and of the ordinary power-supply portion are covered with the photoresist 204. In the region of the memory cell, the removal of the ONO layer 207 on the region that will become the N+ diffusion region is performed by plasma etching in a gaseous environment of $CF_4$ or $CHF_3+O_2$.

Thereafter, As (arsenic) ions are implanted in the silicon substrate 201 at implantation energy of 30 to 60 Kev and a dose of 1E15 $cm^{-2}$, thereby forming N+ diffusion regions 213.

The N+ diffusion regions 213 correspond to the conductive regions 104 of the memory cell MC shown in FIG. 1. In addition, the N+ diffusion regions 213 correspond to the diffusion regions 107 and 108 of the selection transistor 102 in FIG. 1. In FIG. 1, the cross section in the vertical direction of the diffusion regions 107 and 108 of the selection transistor 102 (the cross section along the longitudinal direction of the main bit lines 101) and the cross section in the horizontal direction of the two conductive regions 104 of the memory cell MC (the cross section along the longitudinal direction of the gate electrodes 110) intersect each other perpendicularly. In FIGS. 6A to 10C, however, these are depicted schematically in the same drawing.

Next, the photoresist 204 is provided so as to expose the ONO film on the regions of the transistors of the high-withstand-voltage (HV) portion on the side of the peripheral circuitry and of the ordinary power-supply (Vcc) portion, as well as on the region where the selection transistor will be formed.

Figure 6B:
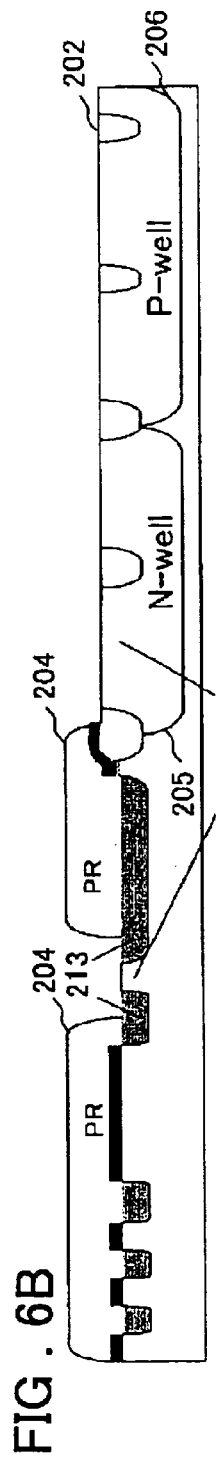

With the photoresist 204 serving as a mask, the ONO layer on the diffusion regions 213 in the region where the selection transistor (selector) will be formed and the ONO layer in the region where the transistor of the peripheral circuitry will be formed are removed by etching in a plasma environment, as shown in FIG. 6B.

Figure 6C:
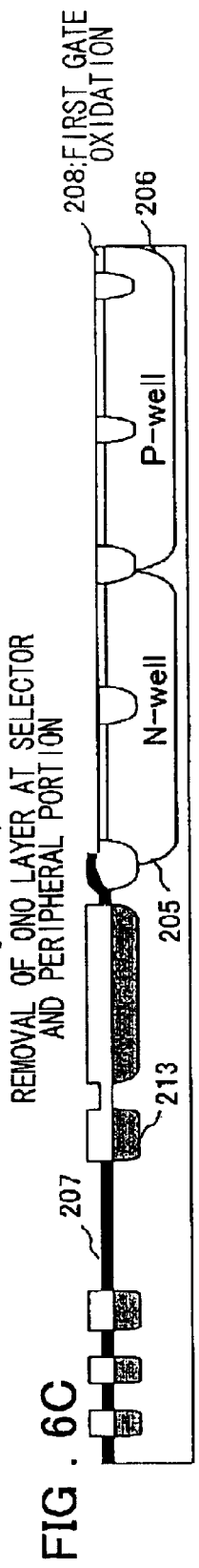

The photoresist 204 is removed. Then, as shown in FIG. 6C, the surface of the silicon semiconductor substrate 201 is oxidized using the remaining ONO layer 207 and field oxide film 202 as masks, thereby forming a silicon-oxide film (referred to as a "first gate oxide film") 208 having a thickness of, e.g., 10 to 20 nm.

Figure 6D:
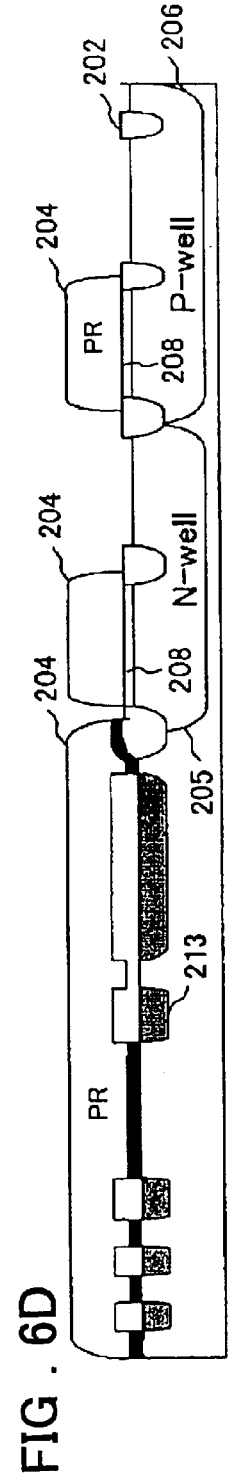

Next, as depicted in FIG. 6D, the photoresist 204 is provided selectively on the region of the memory cell, the selection transistor and the n- and p-channel transistor regions of the high-withstand-voltage (HV) portion. The first gate oxide film 208 on the region where the transistor of the ordinary power-supply (Vcc) portion is formed is etched away using the photoresist 204 as a mask.

Next, as shown in FIG. 7A, a silicon-oxide film (referred to as a "second gate oxide film") 209 having a thickness of, e.g., 3 to 10 nm is formed in an oxidizing environment on the silicon semiconductor substrate 201 in the region where the Vcc transistors will be formed. Since the earlier formed first gate oxide film 208 has not been removed, the gate oxide film (gate oxide film of the high-withstand-voltage transistor) in the region where the high-withstand-voltage (HV) transistor is formed becomes thicker than the silicon-oxide film of the first gate oxide film 208 owing to formation of the second gate oxide film 209. The film thickness of the Vcc gate insulating film and the film thickness of the HV gate insulating film are each set in accordance with the operating voltages of the transistors.

Next, phosphorous-doped polysilicon is deposited using the CVD method. The film thickness is made, e.g., 100 to 200 nm. Etching is then performed in a plasma environment using a photoresist (not shown) as a mask, thereby forming gate electrodes (polysilicon gate electrodes) 210, as shown in FIG. 7B. At this time at least the silicon-nitride film and the lowermost silicon-oxide film of the ONO layer 207 are left remaining in the region of the memory cell. The enclosed area indicated at A1 in FIG. 7B represents two gate electrodes 110 (the polysilicon gates 210 at A1) when viewed from the end face along the direction of arrow X in FIG. 1 as seen from the side of, e.g., of the selection transistor 102 in FIG. 1.

Next, as shown in FIG. 7C, the peripheral circuit portion is covered by the photoresist 204 and B (boron) ions are implanted for the purpose of element isolation between the N+ diffusion regions 213 of the memory cell. At this time an implantation energy is selected that will not allow penetration of the polysilicon gate electrodes 210 and field oxide film 202 will not be penetrated. The implantation energy of the boron ions preferably is, e.g., 15 Kev and a dose is 5E12 to 5E13 $cm^{-2}$.

Next, the photoresist 204 is coated, the photoresist 204 is exposed and developed, and the photoresist of the n-channel transistor region of the high-withstand-voltage (HV) portion and ordinary voltage (Vcc) portion is removed. In order to form an LDD (Lightly Doped Drain)-structure low-concentration region (referred to as an "LDD region" or "extension region") of the n-channel transistor of the high-withstand-voltage (HV) portion and ordinary power-supply (Vcc) portion, as shown in FIG. 8A, P (phosphorous) is implanted at an implantation energy of, e.g., 30 Kev and a dose of 5E13 $cm^{-2}$.

Next, as shown in FIG. 8B, in order to form an LDD-structure low-concentration region of the p-channel transistor of the high-withstand-voltage (HV) portion and ordinary power-supply (Vcc) portion, B (boron) is implanted at an implantation energy of, e.g., 15 Kev and a dose of 5E13 $cm^{-2}$. It should be noted that this step may be used also for the implantation (see FIG. 7C) of the boron for element isolation between N+ diffusion regions of the memory cell.

After the photoresist is removed, spacers 211 on the sidewalls of the gate polysilicon electrodes 210 are formed by a well-known method, as shown in FIG. 8C. Specifically, and by way of example, a silicon-oxide film having a conformal step coverage is deposited as by the CVD method and anisotropic etching is performed leaving the side walls. The film thickness of the side-wall spacers 211 decides the width of the low-concentration region constituting the electrical junction with the channel of the source/drain diffusion region and is made, e.g., 50 to 200 nm in this embodiment.

Figure 9A:
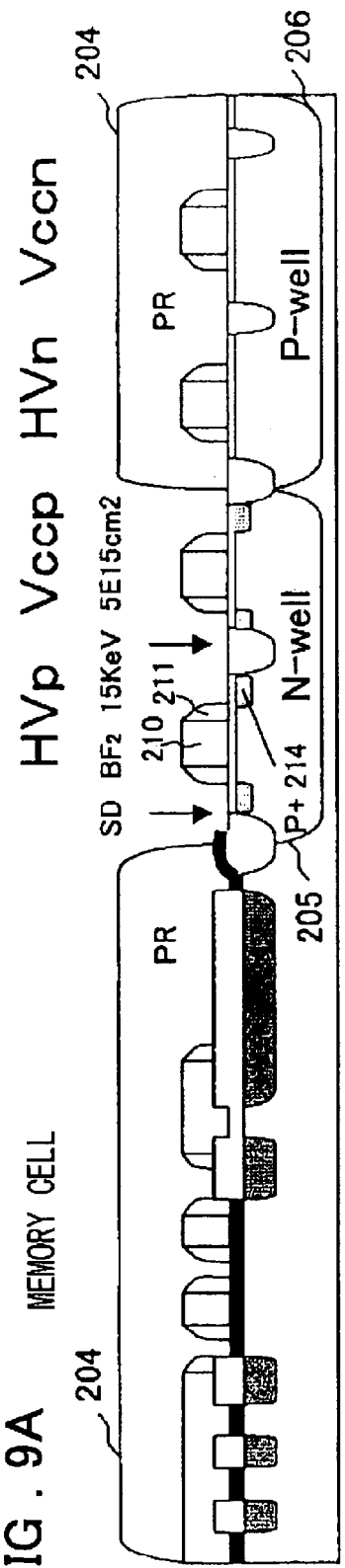

Next, as shown in FIG. 9A, the region of the memory cell and the region of the n-channel transistor are covered by the photoresist 204, and the source and drain diffusion regions 214 (contact regions having an LDD structure) of the p-channel transistor are formed. At this time BF2 (boron fluoride) ions preferably are implanted at implantation energy of, e.g., 15 Kev and a dose of 1E15 to 1E16 $cm^{-2}$.

Figure 9B:
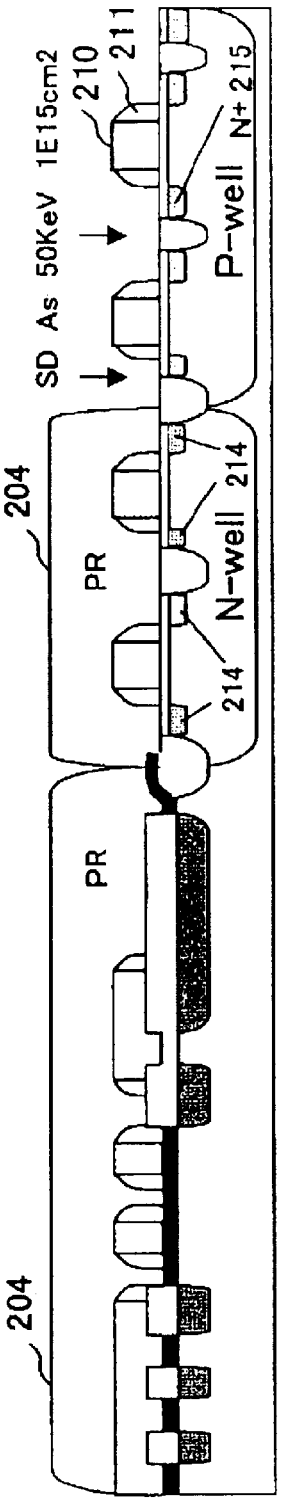

Next, as shown in FIG. 9B, the region of the memory cell and the region of the p-channel transistor are covered by the photoresist 204, and the source and drain diffusion regions 215 (also referred to as contact regions) of the n-channel transistor are formed. At this time As (arsenic) is implanted at an implantation energy of, e.g., 50 Kev and a dose of 1E15 to 1E16 $cm^{-2}$. Thereafter, following heat treatment as necessary, the silicon-oxide film, etc., present on the surface at locations where silicidation is performed is removed.

Figure 10A:
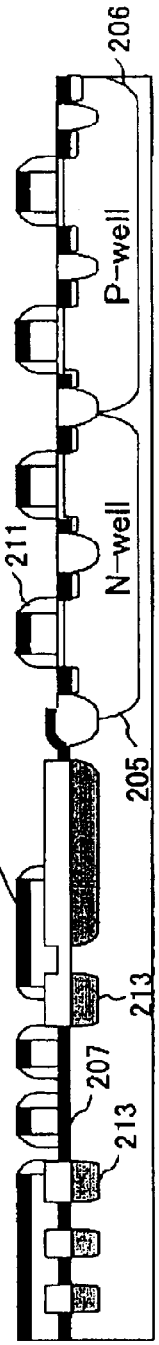

Next, as shown in FIG. 10A, Co is formed on the substrate surface to a film thickness of, e.g., 8 to 20 nm by the sputtering method. That is, the Co-sputtered film is formed over the entire surface of the substrate. In order to achieve the Salicide structure, annealing (lamp annealing) is carried out, whereby $CoS_{i2}$ is formed at the portions where the Co contacts the silicon and polysilicon. On the other hand, nothing occurs at the regions where the silicon-dioxide film ($SiO_2$) and Co-sputtered film contact, as at the sidewall spacers 211. In general, lamp annealing is carried out for 11 to 60 seconds at a temperature of 650 to 720° C., by way of example. As a result, the surface of the polysilicon 210 of the gate electrode is silicidated at the same time as the source/drain diffusion regions (contact regions) 214 and 215, whereby Co Salicide 212 is formed.

Thereafter, processing for removing Co that did not undergo the Salicide reaction on the substrate, such as at the surface of the sidewall spacers 211 that contact the $SiO_2$, is executed. The Co-sputtered film on the sidewall spacers 211 is removed by wet processing, etc.

In this embodiment, the Co cannot react with the silicon substrate in the Salicide step at locations where the ONO layer 207 has been left remaining. This makes it possible to avoid short-circuiting of the N+ diffusion regions.

Figure 10B:
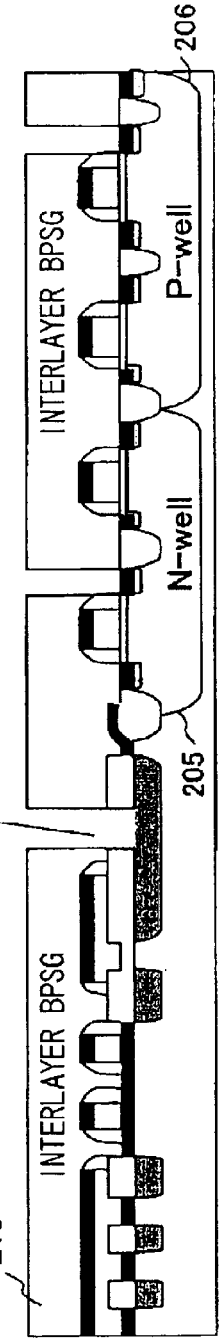
Figure 10C:
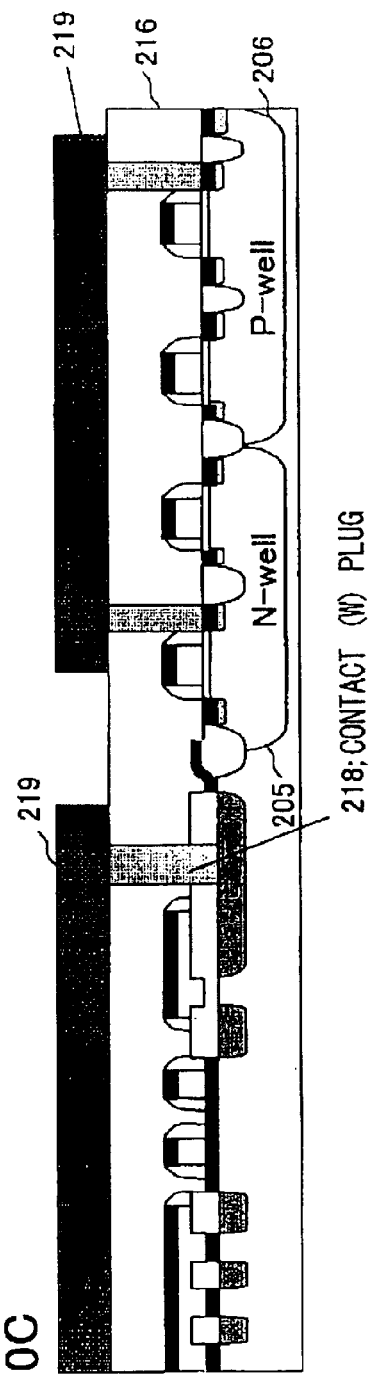

Next, as shown in FIG. 10B, an inter-layer BPGS (Boro-Phospho Silicate Glass) film 216 is formed and contact holes 217 are provided in the film.

The contact holes 217 are filled with (W) plugs 218, a metal film is deposited over the entire surface of the substrate, and patterns are formed by photoresist and etching steps, thereby forming a metal interconnect layer 219.

Figure 11:
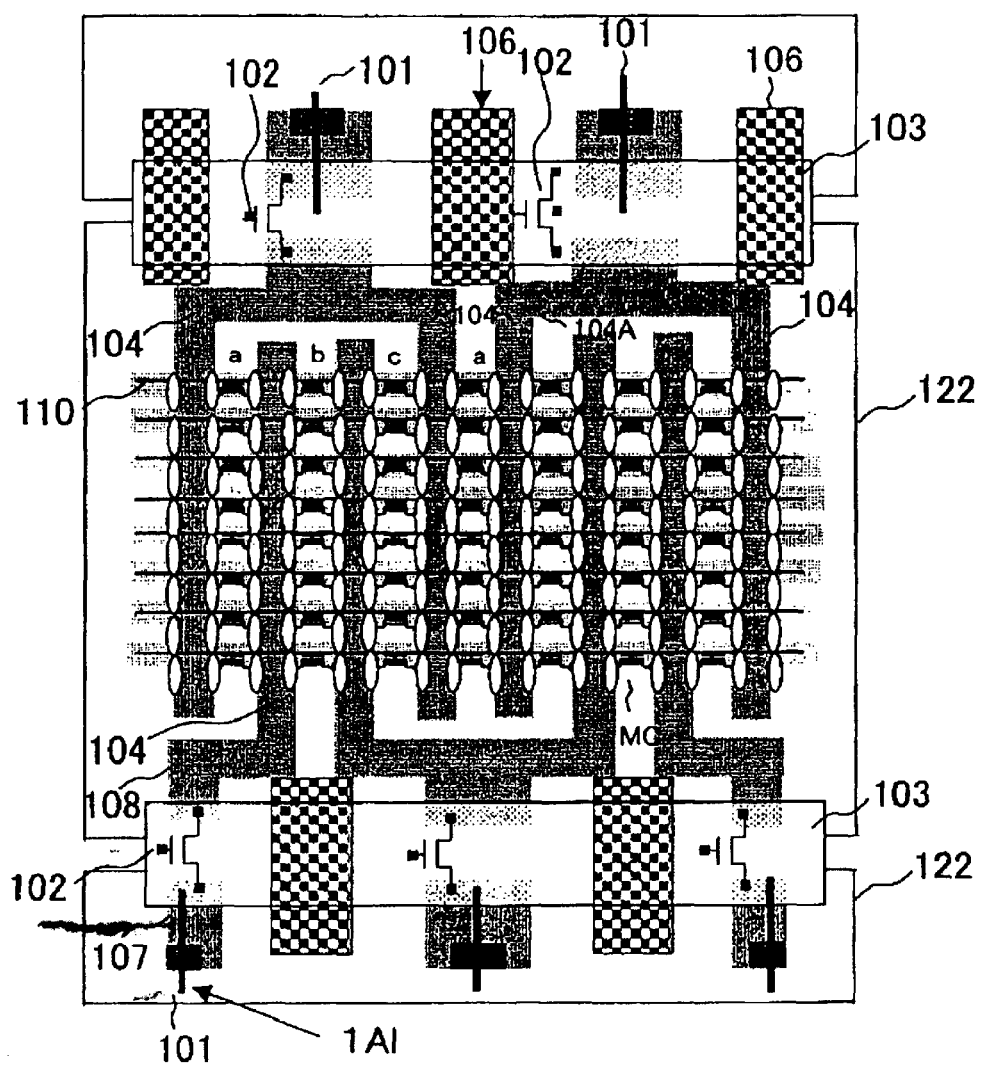
FIG. 11 is a diagram illustrating the layout of another embodiment according to the present invention.

FIG. 11 is a diagram illustrating the layout of a semiconductor memory device according to another embodiment of the present invention. As shown in FIG. 11, this embodiment differs from that of FIG. 1 in that end portions of the pair of conductive regions 104 that construct a set of sub-bit lines are interconnected by a conductive region 104A, the main bit lines 101 are provided on the first aluminum interconnect layer (1 Al), and a connection to the diffusion regions of the selection transistors 102 is performed by contacts.

In this embodiment also, the ONO layer 122 is provided in the channel region immediately underlying the gate electrode 110 and in other regions with the exception of the N+ diffusion regions. As shown in FIG. 11, the semiconductor device according to this embodiment has the plurality of conductive regions 104 extending in parallel in spaced-apart relation on the substrate surface along one direction thereof. Two of the conductive regions 104 serve as a pair (e.g., a and a), one ends of which are interconnected by the conductive region 104A provided in the substrate surface in a direction that perpendicularly intersects the conductive regions 104, whereby one set of sub-bit lines are formed. The conductive regions 104 and the conductive region 104A both are composed by N+ diffusion regions formed in the surface of the P-type silicon semiconductor substrate, and the one set of sub-bit lines have a two-dimensional configuration that defines a U-shaped pattern. The transistors 102 that connect the one set of sub-bit lines to the corresponding main bit lines 101 are disposed on both sides of the memory cell array. A plurality of sets of the sub-bit lines connected to the selection transistors 102 disposed on one side of the memory cell array and a plurality of sets of the sub-bit lines connected to the selection transistors 102 disposed on the other side of the memory cell array are arranged in inter-digital or alternate fashion. In this embodiment also the gate electrodes of the transistors in the peripheral circuitry (not shown) and the gate electrodes 103 of the selection transistors 102 have a Co Salicide structure. Further, the gate electrodes 110 of the memory cell in which the ONO layer serves as the gate dielectric film also have a Co Salicide structure.

The structure of this embodiment also is such that the surface of the silicon substrate between two conductive regions 104 is covered by the ONO layer in the Salicide step relating to the gate electrode 110. As a result, Co silicidation does not take place and short-circuiting of the conductive regions 104 is avoided.

Though the present invention has been described in accordance with the foregoing embodiments, the invention is not limited to these embodiments and it goes without saying that the invention covers various modifications and changes that would be obvious to those skilled in the art within the scope of the claims. For example, though the present invention has been described taking a programmable, readable non-volatile semiconductor memory device as an example, the present invention is applicable to a read-only semiconductor memory device as well. Further, the present invention has been described with regard to a memory cell equipped with an ONO film having two electron trapping regions that store two bits independently in one cell. However, the present invention is not limited to such an arrangement; it may be so arranged that one bit is stored in one cell. Furthermore, the invention is applicable to any MONOS-type transistor. In addition, wiring provided on the top layer on the substrate is not limited to aluminum wiring, and it goes without saying that any metal wiring of low resistance is applicable.

The invention is not limited to Co Salicide structure. The invention is applicable to a Salicide structure of any high-melting-point metal or semiprecious metal the resistance of which can be reduced, such as a Ti Salicide structure.

The meritorious effects of the present invention are summarized as follows.

Thus, according to the present invention as described above, an ONO layer is left in regions besides the channel regions in a semiconductor device having an ONO layer. As a result, the reaction between a metal and a silicon substrate in a Salicide step will not take place in these regions. This means that it is possible to avoid silicidation of the substrate surface between two conductive regions comprising impurity diffusion regions. The result is an improvement in the reliability of the device and an increase in product yield.

In accordance with the present invention, the ONO layer, which performs the function of an electron trapping film in a memory cell, is used as a film for protecting the substrate against silicidation. Silicidation of the substrate surface between conductive regions comprising impurity diffusion regions can be positively prevented in the Salicide step without adding special steps separately to the manufacturing process. This makes it possible to improve the reliability of the device while suppressing an increase in the manufacturing process steps and in overall cost.

In accordance with the present invention, the first and second oxide films of the ONO layer are formed using the ISSG oxidation method. This makes it possible to greatly improve upon the write/erase repetition lifetime specific to a semiconductor memory device having a MONOS structure.

Another advantage of the present invention is addition to those mentioned above is that an increase in chip area that accompanies an increase in memory capacity can be suppressed while reducing the resistance value of a conductive region from the selection transistor to the far end by constructing one set of sub-bit lines using two interconnected conductive regions and arranging a plurality of sets of sub-bit line in interdigital fashion. Furthermore, according to the present invention, element isolation of the selection transistors is achieved by field oxide films, whereby an increase in the withstand voltage of the selection transistors is realized and becomes possible to suppress a decline in the write current (write voltage) to the memory cell when data is written.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a plurality of parallel extending conductive regions comprising an impurity provided on a substrate surface that constitutes a region of a memory cell array; a pair of said conductive regions being interconnected by a wiring constituting an upper layer of the substrate or by a conductive region of the substrate surface, said pair of said conductive regions composing a set of sub-bit lines;
   a plurality of gate electrodes formed in a direction that perpendicularly intersects the longitudinal direction of the sub-bit lines, said gate electrodes composing word lines;
   a set of the sub-bit lines being connected to a main bit line via a selection transistor;
   a plurality of the selection transistors being disposed in opposition on both sides of the memory cell array;
   plural sets of the sub-bit lines connected to respective ones of a plurality of selection transistors on one side of the memory cell array and plural sets of the sub-bit lines connected to respective ones of a plurality of selection transistors on the other side of the memory cell array being arranged in interdigital fashion; and
   a memory-cell transistor having an insulating film including first and second oxide films, and a nitride film sandwiched between said first and second oxide films, provided on the substrate surface, and a Salicide-structure gate electrode provided on the insulating film;
   wherein said insulating film is provided even in a region besides a channel region immediately underlying the gate electrode of the memory-cell transistor.

2. The device according to claim 1, wherein the insulating film is left remaining in the channel region and at locations other than areas where the conductive regions of the memory cell array are formed.

3. The device according to claim 1, wherein the insulating film is left remaining at least in areas between the conductive regions of the substrate surface of the memory cell array.

4. The device according to claim 1, wherein the insulating film that is left remaining includes at least the first oxide film and the nitride film from among the three films laminated on the substrate.

5. A semiconductor device comprising:
   a substrate, whose surface constitutes a region of a memory cell array;
   an insulating film provided on the substrate, said insulating film comprising first and second oxide films, and a nitride film sandwiched between said first and second oxide films; and
   a Salicide-structure gate electrode included in a selection transistor and disposed on said insulating film, a portion of said insulating film being included in said memory cell array,
   and a connecting region, between the memory cell array and a periphery region of the semiconductor device,
   said periphery region being capable of withstanding a high voltage.

6. A semiconductor device comprising:
   a plurality of parallel extending conductive regions comprising an impurity provided in a substrate surface that constitutes a region of a memory cell array;
   an insulating film including first and second oxide films, and a nitride film sandwiched between said first and second oxide films, provided on the substrate surface as a dielectric film immediately underlying a gate electrode of a memory-cell transistor in which two of said conductive regions that are mutually adjacent serve as a source and drain; and
   a Salicide-structure gate electrode included in a selection transistor and disposed on said insulating film, a portion of said insulating film being included in said memory cell array;
   wherein said insulating film is provided over an entire surface of the memory-cell transistor and a connecting region, between the memory-cell transistor and a periphery region of the semiconductor device, said periphery region being capable of withstanding a high voltage.

7. The device according to claim 5, wherein said selection transistor is disposed between the memory cell array and said connecting region.

8. The device according to claim 6, wherein said selection transistor is disposed between the memory-cell transistor and said connecting region.

* * * * *